(12) United States Patent
Tain et al.

(10) Patent No.: US 7,610,769 B2
(45) Date of Patent: Nov. 3, 2009

(54) ULTRASONIC ATOMIZING COOLING APPARATUS

(75) Inventors: Ra Min Tain, Hsinchu County (TW); Shu Jung Yang, Hsinchu County (TW)

(73) Assignee: Industrial Technology Research Institute, Hsin Chu (TW)

( * ) Notice: Subject to any disclaimer, the term of this patent is extended or adjusted under 35 U.S.C. 154(b) by 413 days.

(21) Appl. No.: 11/128,349

(22) Filed: May 13, 2005

(65) Prior Publication Data
US 2006/0130506 A1    Jun. 22, 2006

(30) Foreign Application Priority Data
Dec. 16, 2004    (TW) .............................. 93139108 A

(51) Int. Cl.
*F25D 23/12* (2006.01)

(52) U.S. Cl. .................. 62/259.2; 165/80.4; 165/104.33

(58) Field of Classification Search ................ 62/259.2; 361/695, 701, 704; 165/80.4, 104.33, 104.34; 174/15.1
See application file for complete search history.

(56) References Cited

U.S. PATENT DOCUMENTS

| | | | |
|---|---|---|---|
| 5,943,211 A * | 8/1999 | Havey et al. ................ 361/699 |
| 6,190,456 B1 * | 2/2001 | Matsuda ...................... 118/629 |
| 6,247,525 B1 | 6/2001 | Smith et al. |
| 2004/0060508 A1 * | 4/2004 | Pacetti et al. ................ 118/264 |
| 2004/0089050 A1 * | 5/2004 | Daw et al. .................... 73/1.02 |
| 2005/0076664 A1 * | 4/2005 | Sylvia ........................ 62/304 |

\* cited by examiner

*Primary Examiner*—Melvin Jones
(74) *Attorney, Agent, or Firm*—Bacon & Thomas, PLLC

(57) ABSTRACT

An ultrasonic atomizing cooling apparatus is provided. The ultrasonic atomizing cooling apparatus includes a container having working fluid contained therein, an ultrasonic vibration device, a heat-exchange chamber and an atomized droplet passage and a vapor passage made of flexible tubes. By ultrasonically vibrating the working fluid in the container, atomized droplets are generated. The atomized droplets, driven by a fan or a propeller, cause a pressure difference between the atomized droplet passage and the container. The pressure difference propels the atomized droplets to the atomized droplet passage, and sprays the droplets onto a wall surface of the heat-exchange chamber that is in contact with a heat-producing body. The heat-producing body is cooled down. Depending on the position orientation of the heat-producing body, the spraying direction of the present apparatus can be changed. The flexibility of use of the present apparatus is increased.

17 Claims, 6 Drawing Sheets

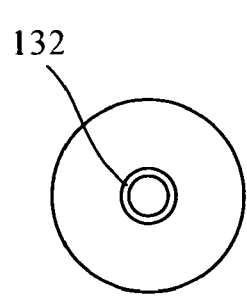
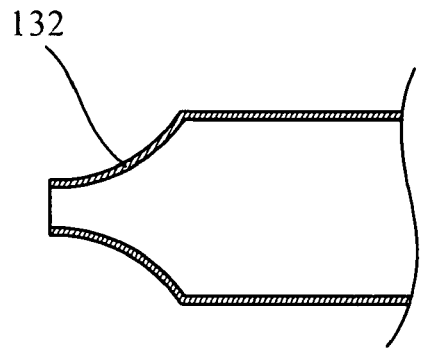
Fig.5A        Fig.6A
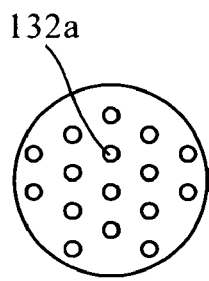
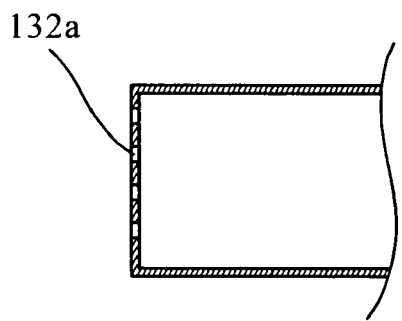
Fig.5B        Fig.6B
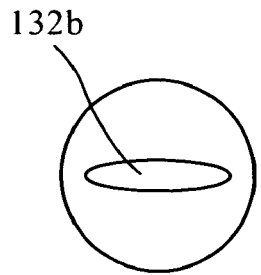
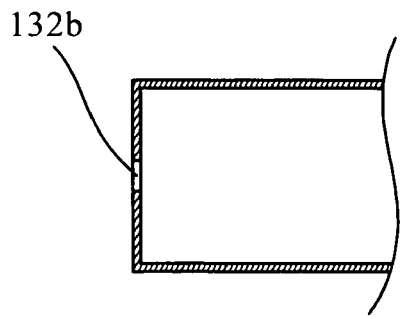
Fig.5C        Fig.6C

ULTRASONIC ATOMIZING COOLING APPARATUS

BACKGROUND OF THE INVENTION

1. Field of the Invention

The present invention relates to a liquid cooling apparatus, and more particularly, to an ultrasonic atomizing cooling apparatus.

2. Description of the Related Art

As rapid growth of electronic, telecommunications and optoelectronics industries continue, related products tend to provide more versatile functions. As such, the integrity of transistors on chips, which govern various functions and performances of products, is increased. A heat dissipation problem accompanied reduced reliability of devices and systems. For example, with respect to optical-communication parts, excess heat causes chip to become damaged, and may also change the output optical wavelength. An investigation conducted by the United States Army shows the ratio of failure for electronic systems caused by temperature is as high as 55%, and the power consumption tends to increase following Moore's law.

Currently, many industries and research groups are dedicated to developing various cooling techniques to overcome the high power consumption problems of devices, such as the active cooling method and passive cooling method, including the thermoelectric, thermosyphon two-phase flow, single phase in microchannel, two phases in microchannel and the cryogenic cooling method. The liquid cooling method is regarded as a potential power dissipation method that may be able to replace the air-cooling method for the next generation. Recent developments of liquid cooling in chips are focused on direct contact with the chips, such as jet impingement cooling and spray cooling, wherein atomized droplets formed by the assembly manufactured by the microelectromechanical systems (MEMS) process are sprayed onto the chips. The heat is taken away through a phase change of the atomized droplets absorbing thermal energy dissipated from the chip. The jet impingement cooling and the spray cooling are regarded as potential liquid cooling methods for the future. However, the process for manufacturing these assemblies by the micromachining method is very complicated and troublesome. The manufacturing cost is a bottleneck to commercialize the two liquid cooling methods. Moreover, high pressure is required to spray the atomized droplets onto the chips in a uniform liquid film, and to avoid the accumulation of droplets on the chip due to liquid cohesion.

U.S. Pat. No. 6,247,525 B1 discloses a vibration-induced atomizer 30, which integrates an ultrasonic vibration device and a heat-exchange chamber. FIG. 1 is a cross-sectional view of the vibration-induced atomizer 30, which integrates with a chamber 31 filled with a liquid 38 in a gaseous phase. The wall 32 of chamber 31 makes contact with a heat-producing body 33 and the wall 34 of chamber 31 makes contact with a cooling device 36 provided with a plurality of piezoelectric disks 39A-39D. The piezoelectric disks 39A-39D are attached to the exterior surface 35 of the cooling wall 34 and a plurality of condensation sites 46 are formed on the portion of the inner surface 40 of the cooling surface 34 relative to the piezoelectric disks 39B-39C. The piezoelectric disks 39A-39D connect with a driver 42 via wires 41. When the temperature of the liquid 38 in gaseous phase rises, the liquid 38 in gaseous phase along the interior surface 40 of the wall 34 begins to condense and accumulate in the condensation sites 46. Aided by the vibration of the piezoelectric disks 39A-39D, the liquid accumulated in the condensation sites 46 transforms into atomized droplets 44 carrying energy. The atomized droplets 44 release from the wall 34, spraying onto the wall 32 and absorb heat of the wall 32 delivered from the heat-producing body 33. As such, the atomized droplets 44 are vaporized and the heat of the heat-producing body 33 is dissipated. However, the structure of the vibration-induced atomizer 30 confines the application itself. The vibration-induced atomizer 30 cannot fit various heat-producing bodies 33 with different positioning orientations, such as chips positioned with different orientations on printed circuit boards.

Accordingly, the intention is to provide an ultrasonic liquid cooling apparatus, which can fit various heat sources having different positioning orientations.

SUMMARY OF THE INVENTION

One objective of the present invention is to provide an ultrasonic atomizing cooling apparatus, which ultrasonically vibrates working fluid to generate atomized droplets for cooling a high-temperature heat-producing body. By the present apparatus, a low cost, high cooling efficiency cooling mechanism for high temperature is obtained.

It is a further objective of the present invention to provide an ultrasonic atomizing cooling apparatus, which uses flexible tubes to fit various heat sources having different positioning orientations to increase the flexibility of use of the present apparatus.

It is another objective of the present invention to provide an ultrasonic atomizing cooling apparatus, whose components can be manufactured by a general precision machining method without involving complicated microelectromechanical system processes so as to minimize production costs.

According to the above objectives, the present invention provides an ultrasonic atomizing cooling apparatus, which comprises a container with working fluid contained therein, the container having an opening formed on an upper surface thereof; an ultrasonic vibration device disposed in the working fluid of the container to make the working fluid generate atomized droplets; a heat-exchange chamber having a first wall surface, a second wall surface, a third wall surface and a fourth wall surface, the first wall surface opposite to the second wall surface and the third wall surface opposite to the fourth wall surface, wherein the first wall surface makes contact with a heat-producing body, the second wall surface is provided with an atomized droplet entrance, the third wall surface is provided with a vapor exit and the fourth wall surface is provided with an atomized droplet exit; an atomized droplet passage having an entrance and an exit, the entrance communicating with the opening of the container, the exit provided with a nozzle, which passes through the atomized droplet entrance of the second wall surface of the heat-exchange chamber; a vapor passage having a first entrance and a first exit, the first entrance communicating with the vapor exit of the third wall surface of the heat-exchange chamber, and the first exit communicating with the container.

The present apparatus utilizes the ultrasonic vibration device to ultrasonically vibrate the working fluid in the container to generate atomized droplets above the working fluid in the container. The atomized droplets cause a pressure difference between the inside and outside of the container due to the container structure design (for example, adding to a fan, a propeller, etc.). The pressure difference propels the atomized droplets to pass through the atomized droplet passage, and spraying onto the first wall surface of the heat-exchange chamber through the nozzle to conduct heat exchange with the heat-producing body. The atomized droplets then become vapor through phase change. The vapors pass through the vapor passage, where the droplets are cooled, which then flow back to the container. The present invention sprays the atomized droplets directly onto a surface contacting the heat-producing body, and cools the heat-producing body when the atomized droplets absorb thermal energy from the heat-producing body to conduct phase change to become vapor.

The purposes and many advantages of the present invention are illustrated with a detailed description of the embodiment, and become clearly understood with reference to the accompanying drawings.

BRIEF DESCRIPTION OF THE DRAWINGS

FIGS. 5A through 5C show left side views of variances of the nozzle of the present invention; and FIGS. 6A through 6C show cross-sectional views of the variances of the nozzle corresponding to FIGS. 5A through 5C.

DETAILED DESCRIPTION OF THE PREFERRED EMBODIMENTS

The present invention provides an ultrasonic atomizing cooling apparatus, which ultrasonically vibrates working fluid in a container to generate atomized droplets above the working fluid in the container. The atomized droplets cause a pressure difference between the inside and outside of the container due to the specific structure design of the container. The pressure difference propels the atomized droplets along a conduit pipe so that they are directly sprayed onto a surface in contact with a heat-producing body, such as a chip. The atomized droplets absorb thermal energy from the heat-producing body, becoming vapor through phase change, and thus a spray cooling effect of the heat-producing body is obtained.

The present invention employs a spray cooling method with piezoelectric diaphragms disposed on a transducer to generate high-frequency vibrations, and during the vibration process a momentary vacuum is created such that large-sized droplets releasing from the surface of the working fluid are formed as atomized droplets. The atomized droplets cause a pressure difference between the inside and outside of the container due to the specific structure design of the container. As such, the pressure difference propels the atomized droplets through a flexible tube and the droplets are sprayed through a nozzle onto the surface in contact with the heat-producing body. The atomized droplets absorb thermal energy from the heat-producing body, and conducting phase change to become vapor so that the spray cooling effect of the heat-producing body is obtained. Moreover, the nozzle of the present invention can be manufactured using general precision machining processes, without the need to employ any micromachining process. A minimal production cost thus can be attained. In addition, a collecting means can be disposed under the heat-exchange chamber to collect the atomized droplets without conducting heat exchange with the heat-producing body. The vapor generated through phase change of the atomized droplets pass through a cooling pipe, and releasing thermal energy to form droplets. The droplets flow back to the container. As such, a recovery cycle of the working fluid is attained.

The ultrasonic atomized cooling apparatus of the present invention employs flexible tubes in order that the spray direction of the atomized droplets can be adjusted to fit various heat-producing bodies with different positioning orientations. As such, the flexibility of the application of the present cooling apparatus is improved.

Figure 1:
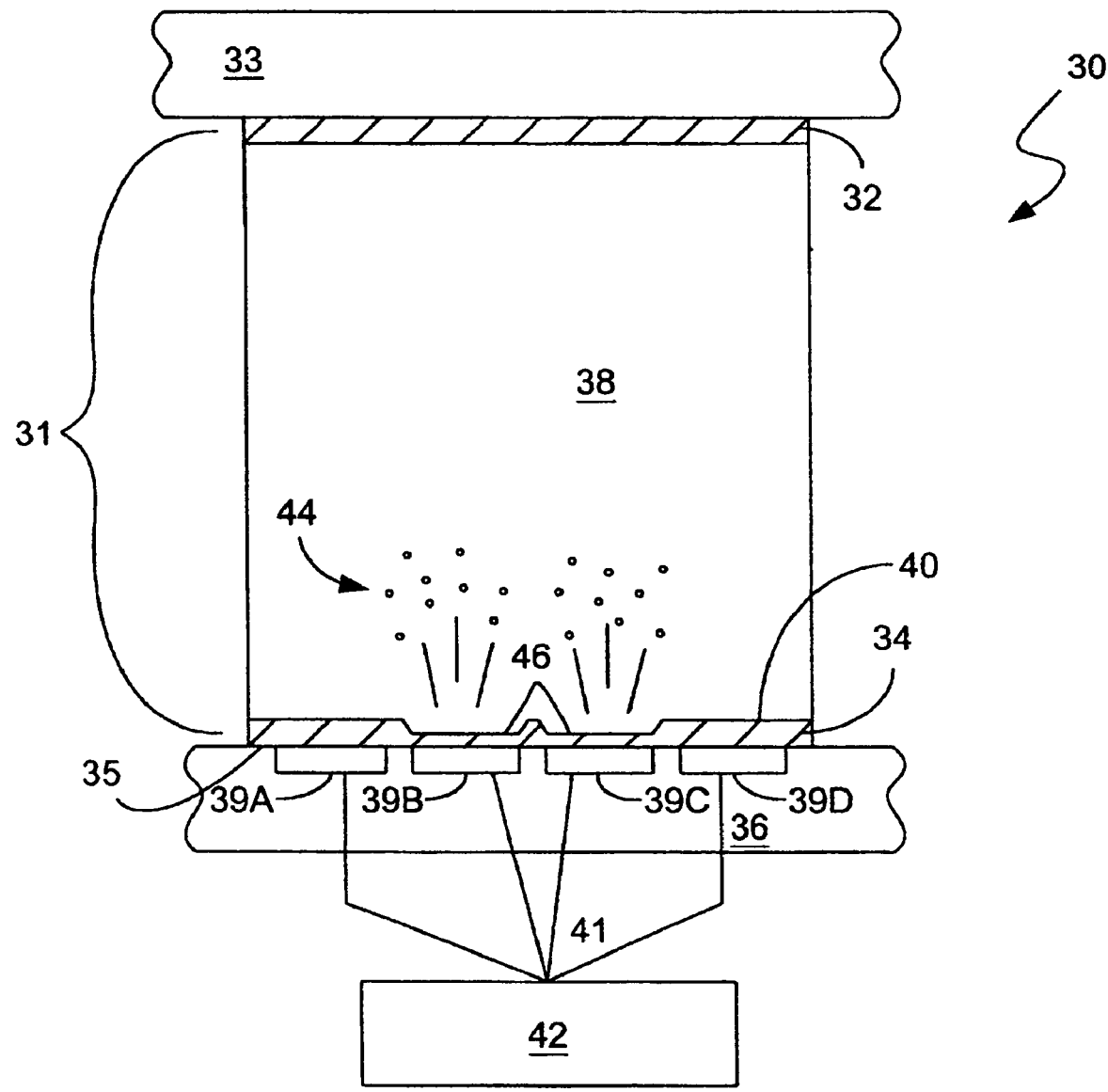
FIG. 1 is a schematic cross-sectional view of a conventional vibration induced atomizer.
Figure 2:
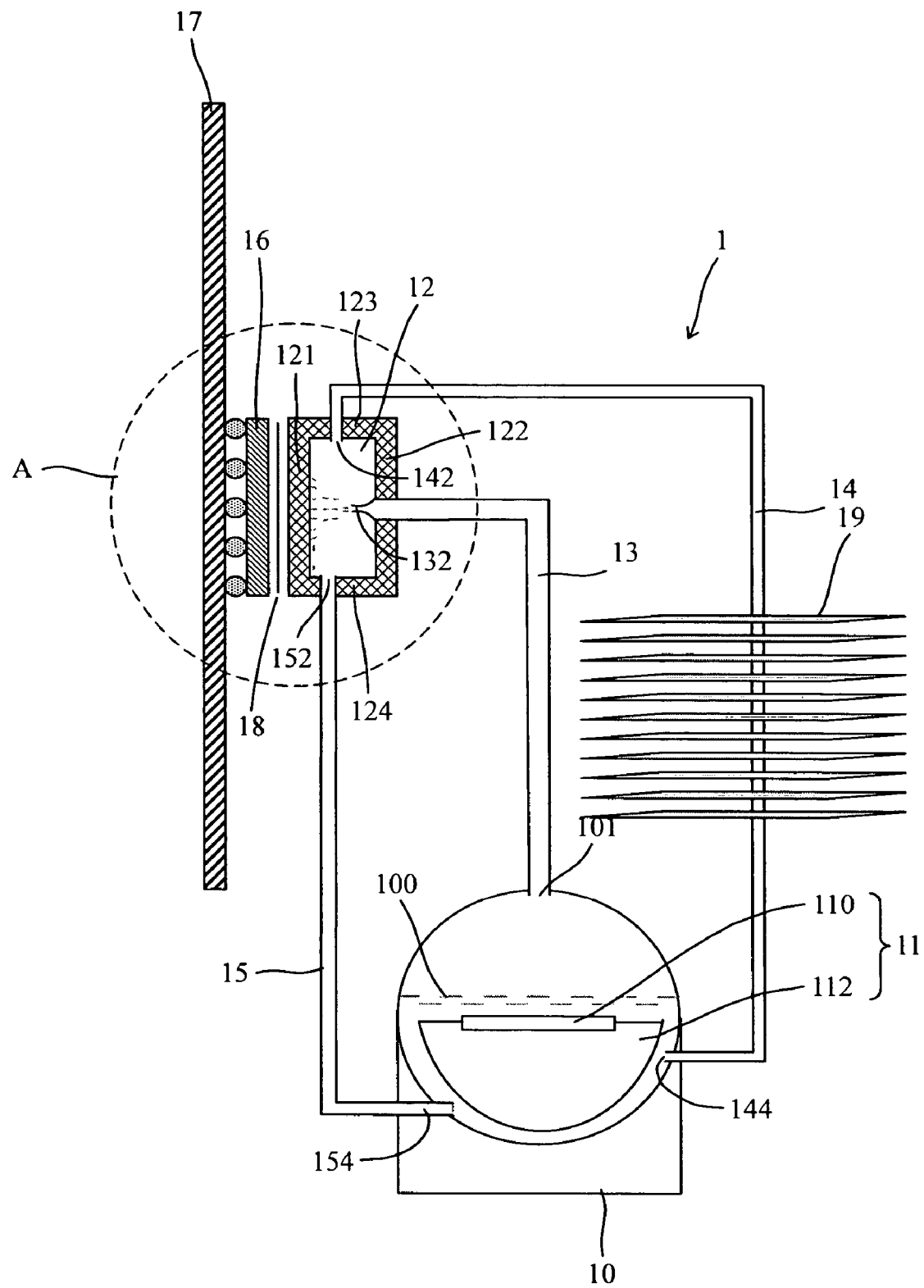
FIG. 2 is a schematic cross-sectional view of an ultrasonic atomizing cooling apparatus according to a first embodiment of the present invention.

FIG. 2 is a schematic cross-sectional view of the present ultrasonic atomizing cooling apparatus according to a first embodiment of the present invention. In the first embodiment, the ultrasonic atomizing cooling apparatus 1 includes a container 10, an ultrasonic vibration device 11, a heat-exchange chamber 12, an atomized droplet passage 13, a vapor passage 14 and a collecting means 15. The container 10 contains working fluid 100 and has an opening 101 formed on an upper surface thereof. The ultrasonic vibration device 11 is disposed in the working fluid 100 to make the working fluid 100 generate atomized droplets. The heat-exchange chamber 12 has a first wall surface 121, a second wall surface 122, a third wall surface 123 and a fourth wall surface 124. The first wall surface 121 is opposite to the second wall surface 122 and the third wall surface 123 is opposite to the fourth wall surface 124. The first wall surface 121 contacts a heat-producing element 16. The second wall surface 122 is provided with an atomized droplet entrance, the third wall surface 123 is provided with a vapor exit and the fourth wall surface 124 is provided with an atomized droplet exit. The atomized droplet passage 13 has an entrance and an exit. The entrance communicates with the opening 101 of the container 10. The exit is provided with a nozzle 132, which passes through the atomized droplet entrance of the second wall surface 122 of the heat-exchange chamber 12. The vapor passage 14 has a first entrance 142 and a first exit 144. The first entrance 142 communicates with the vapor exit of the third wall surface 123 of the heat-exchange chamber 12, and the first exit 144 communicates with the container 10. The collecting means 15 is used for collecting the atomized droplets without phase change in the heat-exchange chamber 12. The collecting means 15 has a second entrance 152 and a second exit 154. The second entrance 152 communicates with the atomized droplet exit of the fourth wall surface 124 of the heat-exchange chamber 12, and the second exit 154 communicates with the container 10.

The working fluid 100 of the container 10 is caused to vibrate by the ultrasonic vibration device 11 which in turn generates the atomized droplets. With the help of a fan or a propeller (not shown) over the container 10, the atomized droplets cause a pressure difference between the container 10 and the atomized droplet passage 13. The pressure difference propels the atomized droplets to pass through the atomized droplet passage 13, and to be sprayed onto the first wall surface 121 of the heat-exchange chamber 12 through the nozzle 132. The atomized droplets sprayed onto the first wall surface 121 conduct heat exchange with the heat-producing element 16 and become vapor through phase change. The vapor pass through the vapor passage 14 having a cooling portion coupled with a plurality of heat-dissipating fins 19, and cool down to droplets, which flow back to the container 10.

The atomized droplet passage 13, vapor passage 14 and the collecting means 15 can be made of flexible tubes. Therefore, the position of the heat-exchange chamber 12 can be adjusted depending on the positioning orientation of the heat-producing element 16. Hence, the first wall surface 121 of the heat-exchange chamber 12 can contact the heat-producing element 16 in different orientations. Moreover, a portion of vapor may pass through the collecting means 15 and then enter the container 10. The collecting means 15 can be filled with porous material, such as but not limited to sponge or sintered powder, as a stopper to prevent the vapor from entering the collecting means 15, and then entering the container 10. Additionally, the inner surface of the vapor passage 14 can be coated with a layer of nano powder to change contact angles with the droplets. The inner surface of the vapor passage 14 also can be made with a capillary structure to aid the flow of fluid. In addition, a thermal interface material 18 is disposed between the heat-producing element 16 and the first wall surface 121 of the heat-exchange chamber 12 to improve thermal conduction between the thermal element 16 and the heat-exchange chamber 12.

Figure 4A:
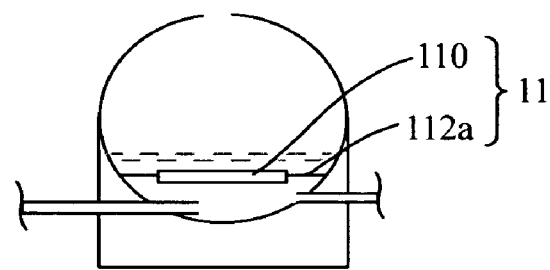
FIGS. 4A through 4C show variances of the container associated with the ultrasonic vibration means of the present invention.
Figure 4B:
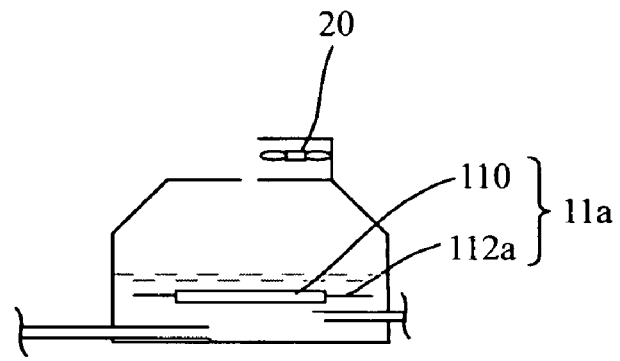
Figure 4C:
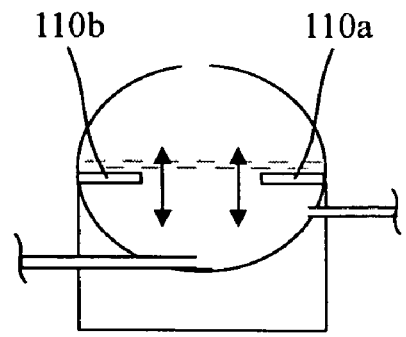

The working fluid 100 can be but is not limited to substances such as water, methanol, ethanol and refrigerants or dielectric fluids. The ultrasonic vibration device 11 can be a piezoelectric vibration device made of a piezoelectric diaphragm 110 and a supporting plate 112 with a convex bottom surface. Referring to FIGS. 4A through 4C, the container 10 and the ultrasonic vibration device 11 can have several variances. For example, the container 10 can have a circular inner shape or a rectangular inner shape or any shape which is substantially equal to aid the atomized droplets that remain in the container 10 to return to the working fluid 100. The ultrasonic vibration device 11 also can be a piezoelectric vibration device 11 a with a flat supporting plate 112a, as shown in FIGS. 4A and 4B, or a piezoelectric vibration device formed of cantilever type transducers 110a and 110b. Additionally, the ultrasonic vibration device 11 can be made to produce constant-frequency vibrations or varied-frequency vibrations by controlling the thickness of the piezoelectric diaphragm and a control circuit. Also, the sizes of the atomized droplets can be controlled via feedback from a sensor of the heat-exchange chamber.

Referring to FIGS. 5A through 5C and FIGS. 6A through 6C, the nozzle 132 of the atomized droplet passage 13 can be made using conventional precision machining processes. The mouth of the nozzle 132 can be made to have a shape such as a nozzle shape 132, a beehives structure 132a, a duck-mouth shape 132b or any shape, which is substantially equal.

Referring to FIG. 2 again, the heat-producing element 16 can be but is not limited to a chip formed on a printed circuit board 17.

Figure 2A:
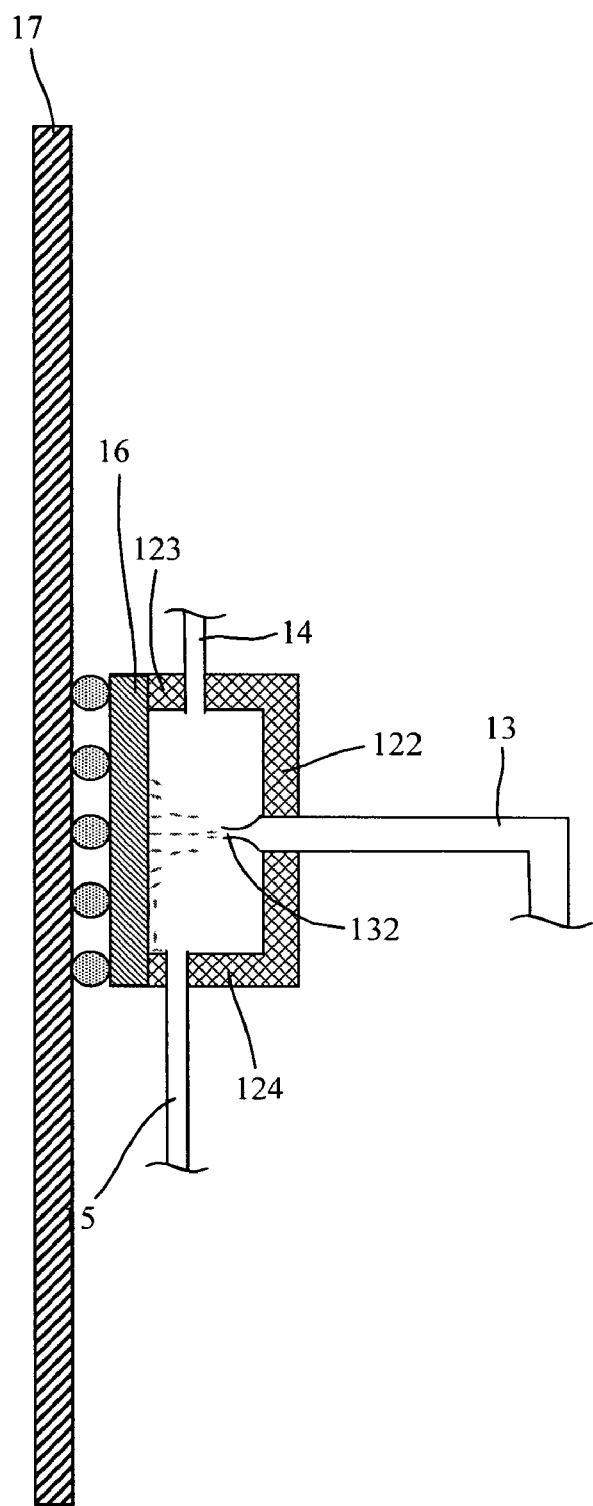
FIG. 2A is a schematic enlarged partial cross-sectional view of an ultrasonic atomizing cooling apparatus according to a second embodiment of the present invention.

FIG. 2A is a schematic enlarged partial cross-sectional view of the ultrasonic atomizing cooling apparatus according to a second embodiment of the present invention, which corresponds to the drawing of part A of FIG. 2. The difference between the second embodiment and the first embodiment is that the heat-exchange chamber 12 of the second embodiment directly contacts the heat-producing element 16 and without the first wall surface 121 as provided in the first embodiment. That means heat-producing element 16 replacing the first wall surface 121 and the heat-exchange chamber 12 is a U-shaped chamber. In other words, the heat-exchange chamber 12 can contact the heat-producing element 16 either directly or indirectly in this invention.

Figure 3:
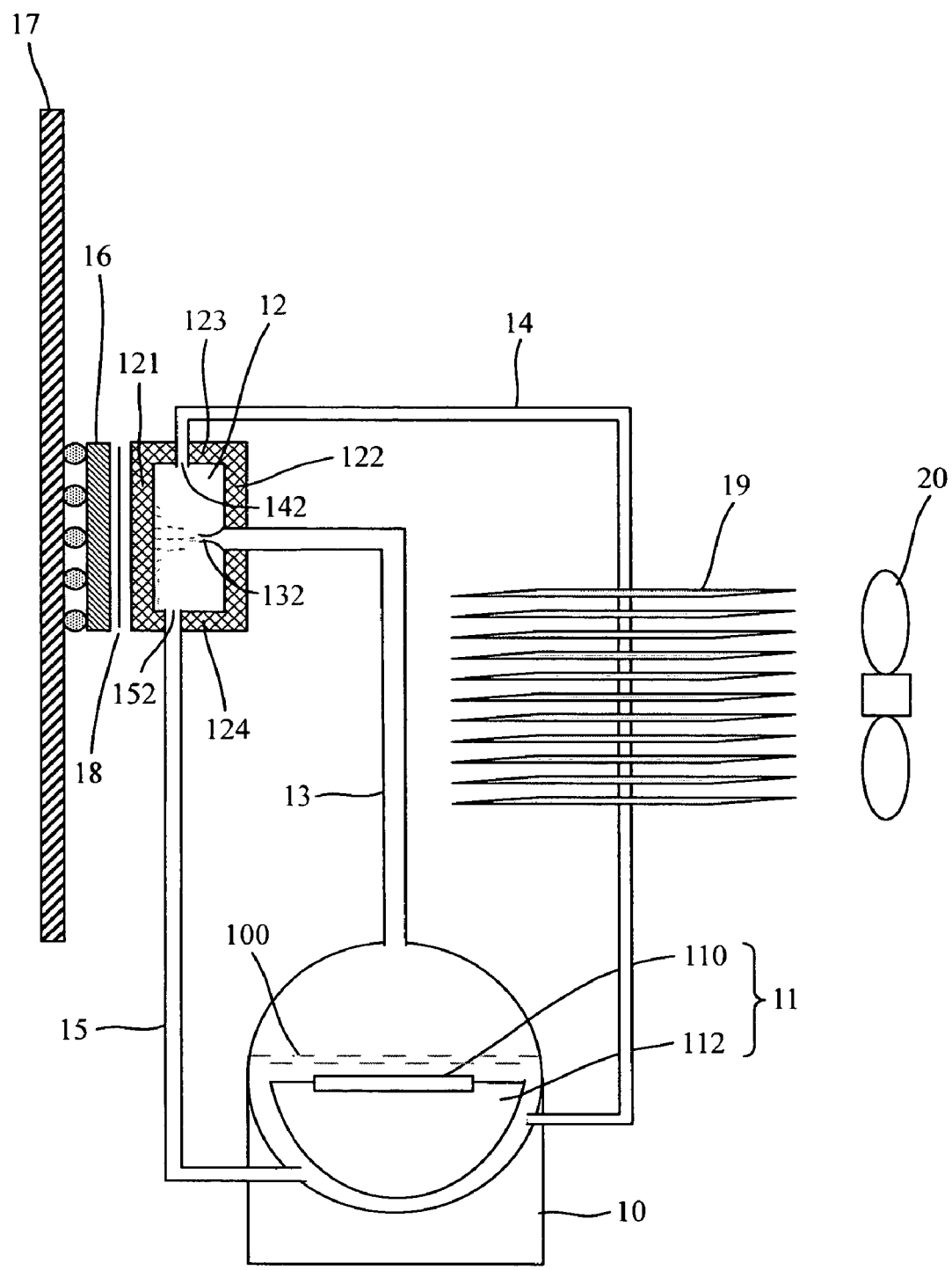
FIG. 3 is a schematic cross-sectional view of an ultrasonic atomizing cooling apparatus according to a third embodiment of the present invention.

FIG. 3 is a schematic cross-sectional view of the ultrasonic atomizing cooling apparatus according to a third embodiment of the present invention. The difference between the third embodiment and the first embodiment is that the vapor passage 14 of the third embodiment is coupled to a heat-dissipating mechanism having a plurality of fins 19 and a fan 20. The heat-dissipating mechanism is used as a cooling mechanism to aid in cooling the vapor passing through the vapor passage 14 so as to form droplets. Moreover, the relative low pressure produced by the fins 19 and fan 20 facilitates condensation, and the vapor being drawn to the vapor passage 14. Moreover, the cooling mechanism can be any structure desired for cooling the vapor to droplets. Alternately, a thermal interface material 18 can be provided between the heat-producing element 16 and the first wall surface 121 of the heat-exchange chamber 12 to improve thermal conduction between the heat-producing element 16 and the heat-exchange chamber 12.

Although the present invention has been described in considerable detail with reference to certain preferred embodiments thereof, those skilled in the art can easily understand that all kinds of alterations and changes can be made within the spirit and scope of the appended claims. Therefore, the spirit and scope of the appended claims should not be limited to the description of the preferred embodiments contained herein.

What is claimed is:

1. An ultrasonic atomizing cooling apparatus, comprising:
   a container with working fluid contained therein, said container having an opening formed on an upper surface thereof;
   an ultrasonic vibration device disposed in the working fluid of said container to generate atomized droplets from the working fluid;
   a heat-exchange chamber having a first wall surface, a second wall surface, a third wall surface and a fourth wall surface, said first wall surface being opposite to said second wall surface and said third wall surface being opposite to said fourth wall surface; wherein said first wall surface contacts a heat-producing body that is outside said heat exchange chamber, said second wall surface is provided with an atomized droplet entrance, and said third wall surface is provided with a vapor exit;
   an atomized droplet passage formed of a flexible tube having an entrance and an exit, said entrance communicating with said opening of said container, said exit provided with a nozzle, which passes through said atomized droplet entrance of said second wall surface of said heat-exchange chamber;
   a vapor passage having a first entrance and a first exit, said first entrance communicating with said vapor exit of said third wall surface of said heat-exchange chamber, and said first exit communicating with said container; and
   a heat-dissipating mechanism coupled to said vapor passage;
   wherein the atomized droplets generated in said container pass through said atomized droplet passage and spray onto said first wall surface of said heat-exchange chamber through said nozzle to conduct heat exchange with said heat-producing body, and the atomized droplets become vapor through phase change, said vapor pass through said vapor passage, and said vapor are cooled down to droplets, which flow back to said container.

2. An ultrasonic atomizing cooling apparatus, comprising:
   a container with working fluid contained therein, said container having an opening formed on an upper surface thereof;
   an ultrasonic vibration device disposed in the working fluid of said container to generate atomized droplets from the working fluid;

an U-shaped heat-exchange chamber having a first wall surface, a second wall surface and a third wall surface opposite to said first wall surface; wherein a heat-producing body opposite to said second wall surface directly contacts said heat-exchange chamber, said second wall surface is provided with an atomized droplet entrance and said first wall surface is provided with a vapor exit;

an atomized droplet passage formed of a flexible tube having an entrance and an exit, said entrance communicating with said opening of said container, said exit provided with a nozzle, which passes through said atomized droplet entrance of said second wall surface of said heat-exchange chamber;

a vapor passage having a first entrance and a first exit, said first entrance communicating with said vapor exit of said first wall surface of said heat-exchange chamber, and said first exit communicating with said container; and a heat-dissipating mechanism coupled to said vapor passage;

wherein the atomized droplets generated in said container pass through said atomized droplet passage and are then sprayed onto said heat-producing body directly through said nozzle to conduct heat exchange with said heat-producing body, and the atomized droplets become vapor through phase change, and the vapor pass through said vapor passage and are cooled and form droplets, which flow back to said container.

3. The ultrasonic atomizing cooling apparatus as defined in claim 1, which further comprises a collecting means to collect the atomized droplets without phase change in said heat-exchange chamber, said collecting means having a second entrance and a second exit, said second entrance communicating with said atomized droplet exit of said fourth wall surface of said heat-exchange chamber, and said second exit communicating with said container.

4. The ultrasonic atomizing cooling apparatus as defined in claim 1, wherein said heat-dissipating mechanism includes a fan and a plurality of heat-dissipating fins.

5. The ultrasonic atomizing cooling apparatus as defined in claim 1, which further comprises a thermal interface material provided between said heat-producing body and said first wall surface of said heat-exchange chamber.

6. The ultrasonic atomizing cooling apparatus as defined in claim 1, wherein said vapor passage is formed of flexible tubes.

7. The ultrasonic atomizing cooling apparatus as defined in claim 3, wherein said collecting means comprises a flexible tube.

8. The ultrasonic atomizing cooling apparatus as defined in claim 1, wherein said ultrasonic vibration device includes at least a piezoelectric vibration transducer.

9. The ultrasonic atomizing cooling apparatus as defined in claim 8, wherein said ultrasonic vibration device includes several cantilever type transducers.

10. The ultrasonic atomizing cooling apparatus as defined in claim 8, wherein said ultrasonic vibration device further comprises a temperature feedback control device of said piezoelectric vibration means for controlling the sizes of the atomized droplets generated.

11. The ultrasonic atomizing cooling apparatus as defined in claim 1, wherein a pump is disposed at said entrance of said atomized droplet passage.

12. The ultrasonic atomizing cooling apparatus as defined in claim 1, wherein said container has an inner shape selected from the following: circular and rectangular.

13. The ultrasonic atomizing cooling apparatus as defined in claim 1, wherein said nozzle has a mouth formed of the following shape: nozzle type, beehives type and duck-mouth type.

14. The ultrasonic atomizing cooling apparatus as defined in claim 3, wherein said collecting means is filled with porous material.

15. The ultrasonic atomizing cooling apparatus as defined in claim 1, wherein an inner wall of said vapor passage is coated with a layer of nano powder.

16. The ultrasonic atomizing cooling apparatus as defined in claim 1, wherein an inner wall of said vapor passage has a capillary structure.

17. The ultrasonic atomizing cooling apparatus as defined in claim 1, wherein the working fluid is selected from the following: water, methanol, ethanol, refrigerants or dielectric fluids.

* * * * *

UNITED STATES PATENT AND TRADEMARK OFFICE
CERTIFICATE OF CORRECTION

PATENT NO. : 7,610,769 B2  Page 1 of 1
APPLICATION NO. : 11/128349
DATED : November 3, 2009
INVENTOR(S) : Tain et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 509 days.

Signed and Sealed this

Twelfth Day of October, 2010

David J. Kappos
*Director of the United States Patent and Trademark Office*